United States Patent
Yamaguchi et al.

(10) Patent No.: US 8,120,942 B2
(45) Date of Patent: Feb. 21, 2012

(54) SEMICONDUCTOR MEMORY DEVICE

(75) Inventors: Takeshi Yamaguchi, Kawasaki (JP);
Mariko Hayashi, Funabashi (JP);
Hirofumi Inoue, Kamakura (JP);
Takeshi Araki, Tokyo (JP); Koichi Kubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 231 days.

(21) Appl. No.: 12/559,931

(22) Filed: Sep. 15, 2009

(65) Prior Publication Data

US 2010/0238702 A1    Sep. 23, 2010

(30) Foreign Application Priority Data

Mar. 23, 2009 (JP) .................................. 2009-69930

(51) Int. Cl.
*G11C 11/00* (2006.01)
(52) U.S. Cl. ...................................... 365/148; 257/295
(58) Field of Classification Search .................. 365/148; 257/295
See application file for complete search history.

(56) References Cited

U.S. PATENT DOCUMENTS

| | | | |
|---|---|---|---|
| 7,045,840 B2 * | 5/2006 | Tamai et al. ................... | 257/295 |
| 7,397,688 B2 * | 7/2008 | Tajiri .............................. | 365/148 |
| 7,433,222 B2 * | 10/2008 | Hosoi et al. .................... | 365/148 |
| 2007/0195581 A1 * | 8/2007 | Morimoto ....................... | 365/148 |
| 2008/0258129 A1 | 10/2008 | Toda | |

FOREIGN PATENT DOCUMENTS

| | | |
|---|---|---|
| JP | 2005-522045 | 7/2005 |
| JP | 2007-201270 | 8/2007 |
| JP | 2008-21750 | 1/2008 |
| JP | 2008-536307 | 9/2008 |
| JP | 2009-49183 | 3/2009 |
| JP | 2010-527151 | 8/2010 |
| WO | WO 2008/140979 A1 | 11/2008 |
| WO | WO 2009/078251 A1 | 6/2009 |
| WO | WO 2009/113699 A1 | 9/2009 |
| WO | WO 2009/122570 A1 | 10/2009 |
| WO | WO 2010/026664 A1 | 3/2010 |

OTHER PUBLICATIONS

Office Action issued Jun. 28, 2011 in Japanese Patent Application No. 2009-069930 (with English translation).
U.S. Appl. No. 13/182,095, filed Jul. 13, 2011, Yamaguchi.
Office Action issued Oct. 4, 2011, in Japanese Patent Application No. 2009-069930 with English translation.

\* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A memory array includes a memory cell, the memory cell being disposed between a first line and a second line and being configured by a variable resistor and a rectifier connected in series. The variable resistor is a mixture of silicon oxide ($SiO_2$) and a transition metal oxide, a proportion of the transition metal oxide being set to 55~80%.

12 Claims, 5 Drawing Sheets

SEMICONDUCTOR MEMORY DEVICE

CROSS REFERENCE TO RELATED APPLICATIONS

This application is based on and claims the benefit of priority from the prior Japanese Patent Application No. 2009-69930, filed on Mar. 23, 2009, the entire contents of which are incorporated herein by reference.

BACKGROUND OF THE INVENTION

1. Field of the Invention

The present invention relates to a semiconductor memory device, more specifically to a semiconductor memory device configured as an arrangement of memory cells that are provided with a variable resistor and are operative to store data by changing the resistance of the variable resistor.

2. Description of the Related Art

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistance varying memory is attracting attention as a candidate to succeed these kinds of semiconductor memory devices utilizing a MOSFET as a memory cell (refer, for example, to Japanese Unexamined Patent Application Publication (Translation of PCT Application) No. 2005-522045). For example, there is known a resistance change memory (ReRAM: Resistive RAM) that has a transition metal oxide as a recording layer and is configured to store a resistance state in a nonvolatile manner.

Write of data to a memory cell is implemented by applying for a short time to a variable resistor a certain setting voltage Vset. As a result, the variable resistor changes from a high-resistance state to a low-resistance state. Hereinafter, this operation to change the variable resistor from a high-resistance state to a low-resistance state is called a setting operation.

In contrast, erase of data in the memory cell MC is implemented by applying for a long time to the variable resistor in the low-resistance state subsequent to the setting operation a resetting voltage Vreset which is lower than the setting voltage Vset of a time of the setting operation. As a result, the variable resistor changes from the low-resistance state to the high-resistance state. Hereinafter, this operation to change the variable resistor from a low-resistance state to a high-resistance state is called a resetting operation. The memory cell, for example, has the high-resistance state as a stable state (a reset state), and, in the case of binary data storage, data write is implemented by the setting operation which changes the reset state to the low-resistance state.

In this kind of conventional resistance change memory, a margin between the setting voltage Vset and the resetting voltage Vreset is small. In a case that the margin is small, there is a chance of a false operation such as a false resetting operation occurring, which is undesirable. A case is considered, for example, where the resetting operation for changing the variable resistor in the low-resistance state to the high-resistance state is implemented using the resetting voltage Vreset. In this case, when the variable resistor is in the low-resistance state, there is not a high voltage applied between terminals of the variable resistor; however, at a moment that the variable resistor shifts to the high-resistance state, a voltage exceeding the setting voltage may be applied to the variable resistor. In such a case, a situation may arise in which the variable resistor once returned to the high-resistance state gets shifted back once again to the low-resistance state (false setting operation). Consequently, there is desired a memory cell in which a large margin can be provided between the setting voltage and the resetting voltage.

Moreover, subsequent to forming a memory cell structure in this kind of resistance change memory, it is necessary to apply to the memory cell a forming voltage which is a voltage greater than a write voltage in order to set the memory cell to a state where it is usable as a memory cell. From a perspective of reducing power consumption, it is desirable to set this forming voltage as low as possible.

SUMMARY OF THE INVENTION

In accordance with an aspect of the present invention, a semiconductor memory device includes a memory cell array that includes a memory cell, said memory cell being disposed between a first line and a second line and being configured by a variable resistor and a rectifier connected in series, the variable resistor being a mixture of silicon oxide ($SiO_2$) and a transition metal oxide, and a proportion of the transition metal oxide being set to 55~80%.

DETAILED DESCRIPTION OF THE EMBODIMENTS

The embodiments of the invention will now be described with reference to the drawings.

[Entire Configuration]

Figure 1:
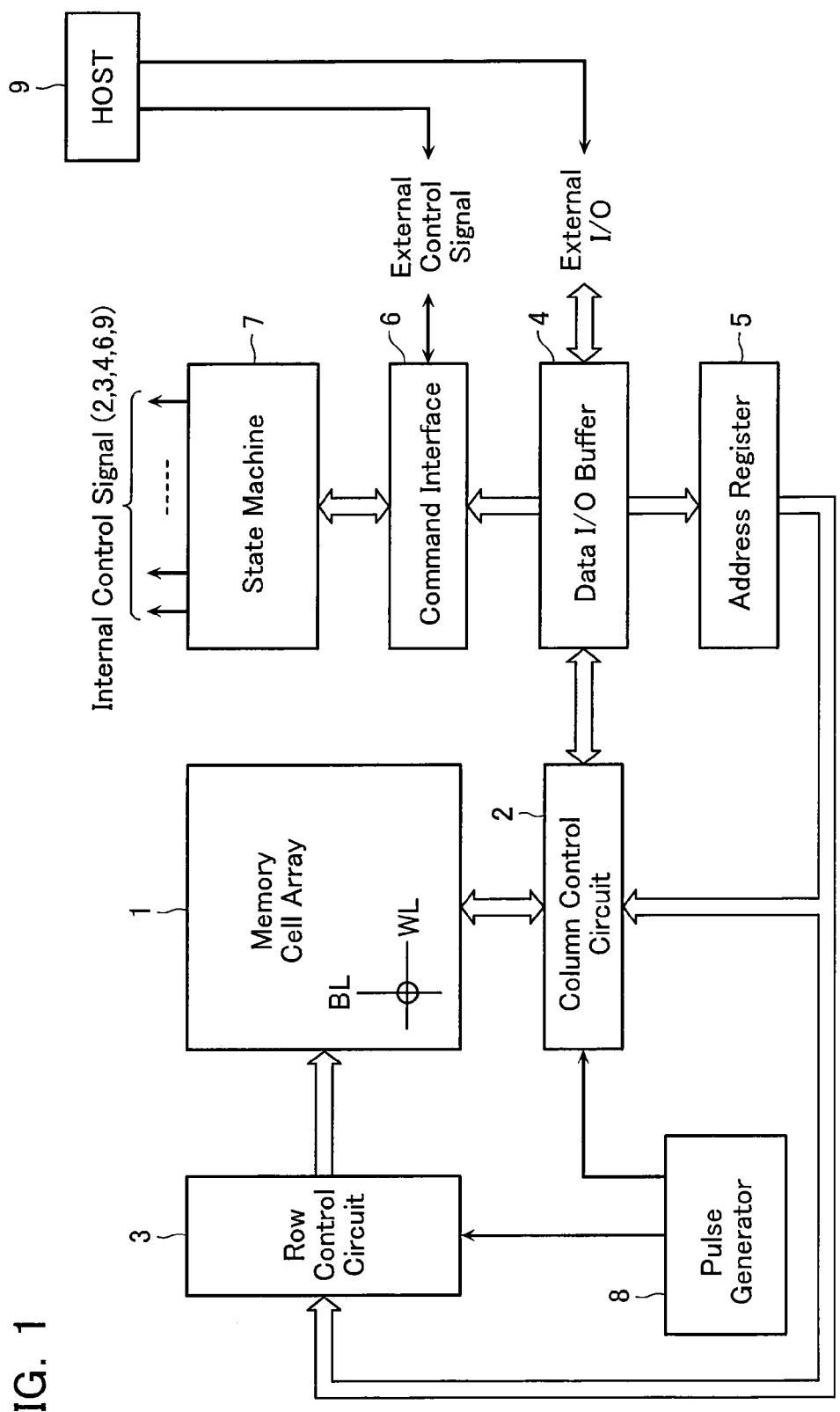
FIG. 1 is a block diagram of a nonvolatile semiconductor memory device in accordance with an embodiment of the present invention.

FIG. 1 is a block diagram of a nonvolatile memory in accordance with a first embodiment of the present invention.

The nonvolatile memory comprises a memory cell array 1 of memory cells arranged in matrix, each memory cell including a later-described ReRAM (variable resistor). A column control circuit 2 is provided at a position adjacent to the memory cell array 1 in the bit line BL direction. It controls the bit line BL in the memory cell array 1 to erase data from the memory cell, write data in the memory cell, and read data out of the memory cell. A row control circuit 3 is provided at a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host 9 via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3.

A command fed from the host 9 to the data I/O buffer 4 is sent to a command interface 6. The command interface 6 receives an external control signal from the host 9 and decides whether the data fed to the data I/O buffer 4 is write data, a command or an address. If it is a command, then the command interface 6 transfers it as a received command signal to a state machine 7.

The state machine 7 manages the entire nonvolatile memory to receive commands from the host 9 via the command interface 6 to execute read, write, erase, and execute data I/O management. The external host 9 can also receive status information managed by the state machine 7 and decides the operation result. The status information is also utilized in control of write and erase.

The state machine 7 controls a pulse generator 8. Under this control, the pulse generator 8 is allowed to provide a pulse of any voltage at any timing.

The pulse formed herein can be transferred to any line selected by the column control circuit 2 and the row control circuit 3. Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

[Memory Cell Array and Peripheral Circuits]

Figure 2:
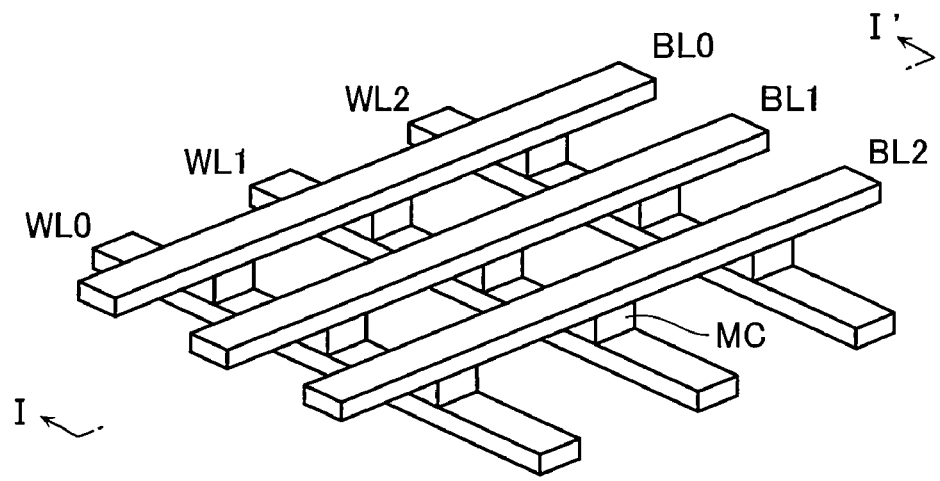
FIG. 2 is a perspective view of part of a memory cell array 1.
Figure 3:
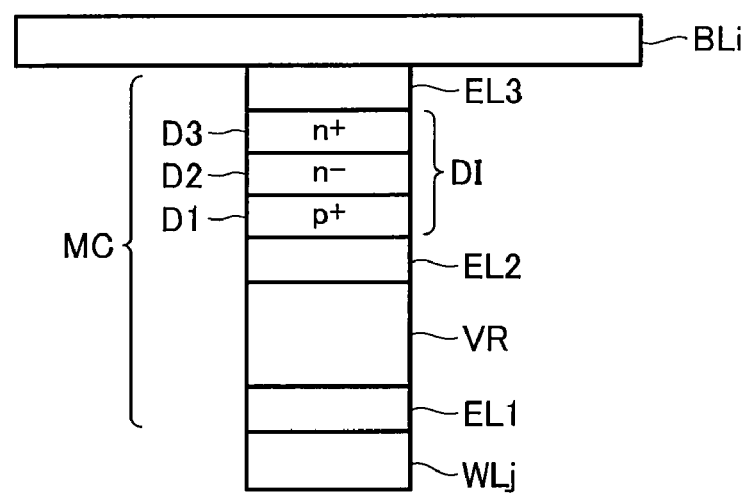
FIG. 3 is a cross-sectional view of one memory cell taken along a line I-I' and seen from the direction of the arrow in FIG. 2.

FIG. 2 is a perspective view of part of the memory cell array 1, and FIG. 3 is a cross-sectional view of one memory cell taken along a line I-I' and seen in the direction of the arrow in FIG. 2. There are plural first lines or word lines WL0-WL2 disposed in parallel, which cross plural second lines or bit lines BL0-BL2 disposed in parallel. A memory cell MC is arranged at each intersection of both lines so as to be sandwiched therebetween. Desirably, the first and second lines are composed of heat-resistive low-resistance material such as W, WSi, NiSi, CoSi.

[Memory Cell MC]

The memory cell MC comprises a serial connection circuit of a variable resistor VR and a diode DI, as shown in FIG. 3. The variable resistor VR can vary the resistance through current, heat, or chemical energy on voltage application. Arranged on an upper and a lower surface thereof are electrodes EL1, EL2 serving as a barrier metal layer and an adhesive layer. Material of the electrodes EL1, EL3 may include such as Pt, Au, Ag, TiAlN, SrRuO, Ru, RuN, Ir, Co, Ti, TiO, Cu, TiN, TaN, LaNiO, Al, PtIrOx, PtRhOx, Rh/TaAlN, and W. Material of the electrode EL2 may include such as W, WN, TaN, TiN, Pt, Cu, TiAlN, TaSiN, $TaSi_2$, TiC, TaC, and $Nb-TiO_2$, consideration being given to a work function. The electrodes EL1, EL3 may also be made from a material similar to the material used in the electrode EL2. A metal film capable of achieving uniform orientation may also be interposed. A buffer layer, a barrier metal layer and an adhesive layer may further be interposed.

The variable resistor VR is configured from a composite oxide film of silicon oxide (SiO2) and a transition metal oxide. The transition metal oxide is, for example, manganese oxide (MnO2) but may be an oxide of another transition metal such as, for example, cobalt (Co), iron (Fe), nickel (Ni), hafnium (Hf), zirconium (Zr), and titanium (Ti). This kind of composite oxide film may be formed by simultaneously spattering silicon oxide and the material to be oxidized such as cobalt (Co), iron (Fe), manganese (Mn), nickel (Ni), hafnium (Hf), zirconium (Zr), and titanium (Ti). A proportion (atomic percentage) of the transition metal oxide in this kind of composite oxide film is set to 55~80% based on a perspective of providing a broad margin between a setting voltage Vset and a resetting voltage Vreset and of lowering a forming voltage. This is described in detail later.

[Variant Example of Memory Cell Array]

Figure 4:
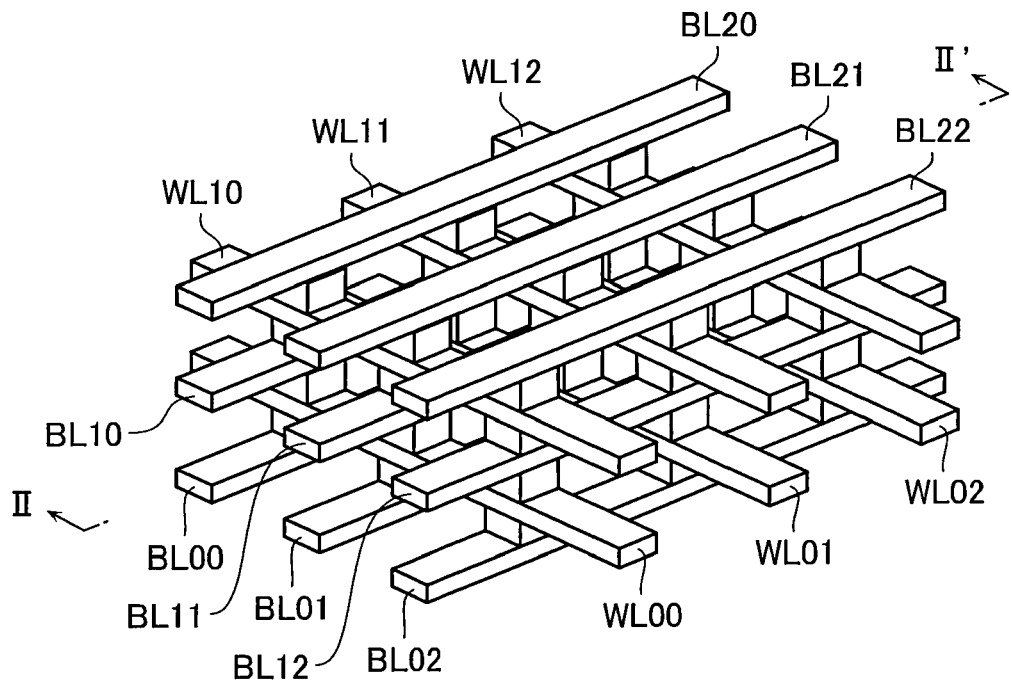
FIG. 4 shows another example of a configuration of the memory cell array 1.
Figure 5:
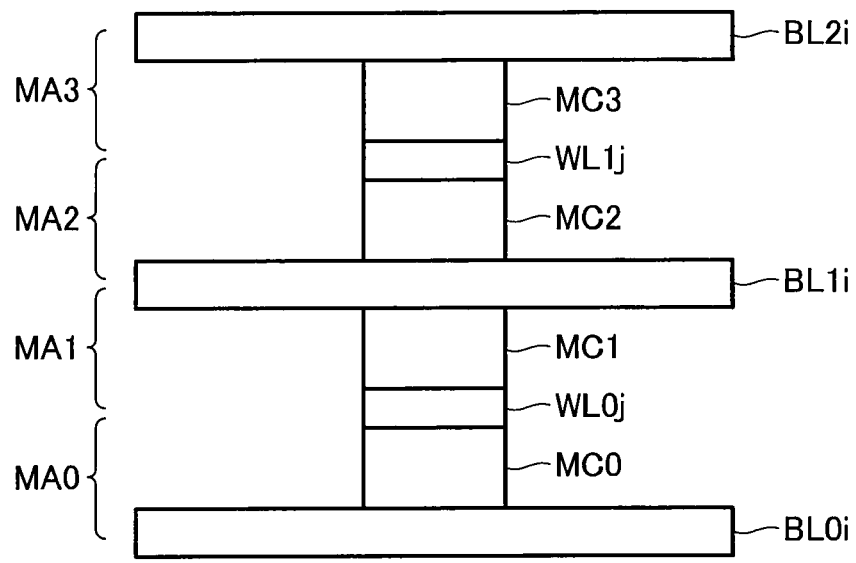
FIG. 5 shows the other example of a configuration of the memory cell array 1.

Plural such memory structures described above may be stacked to form a three-dimensional structure as shown in FIG. 4. FIG. 5 is a cross-sectional view showing a II-II' section in FIG. 4. The shown example relates to a memory cell array of a 4-layer structure having cell array layers MA0~MA3. A word line WL0$j$ is shared by an upper and a lower memory cells MC0, MC1. A bit line BL1$i$ is shared by an upper and a lower memory cells MC1, MC2. A word line WL1$j$ is shared by an upper and a lower memory cells MC2, MC3.

In place of the line/cell/line/cell repetition, an interlayer insulator may be interposed as a line/cell/line/interlayer insulator/line/cell/line between cell array layers. The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 6:
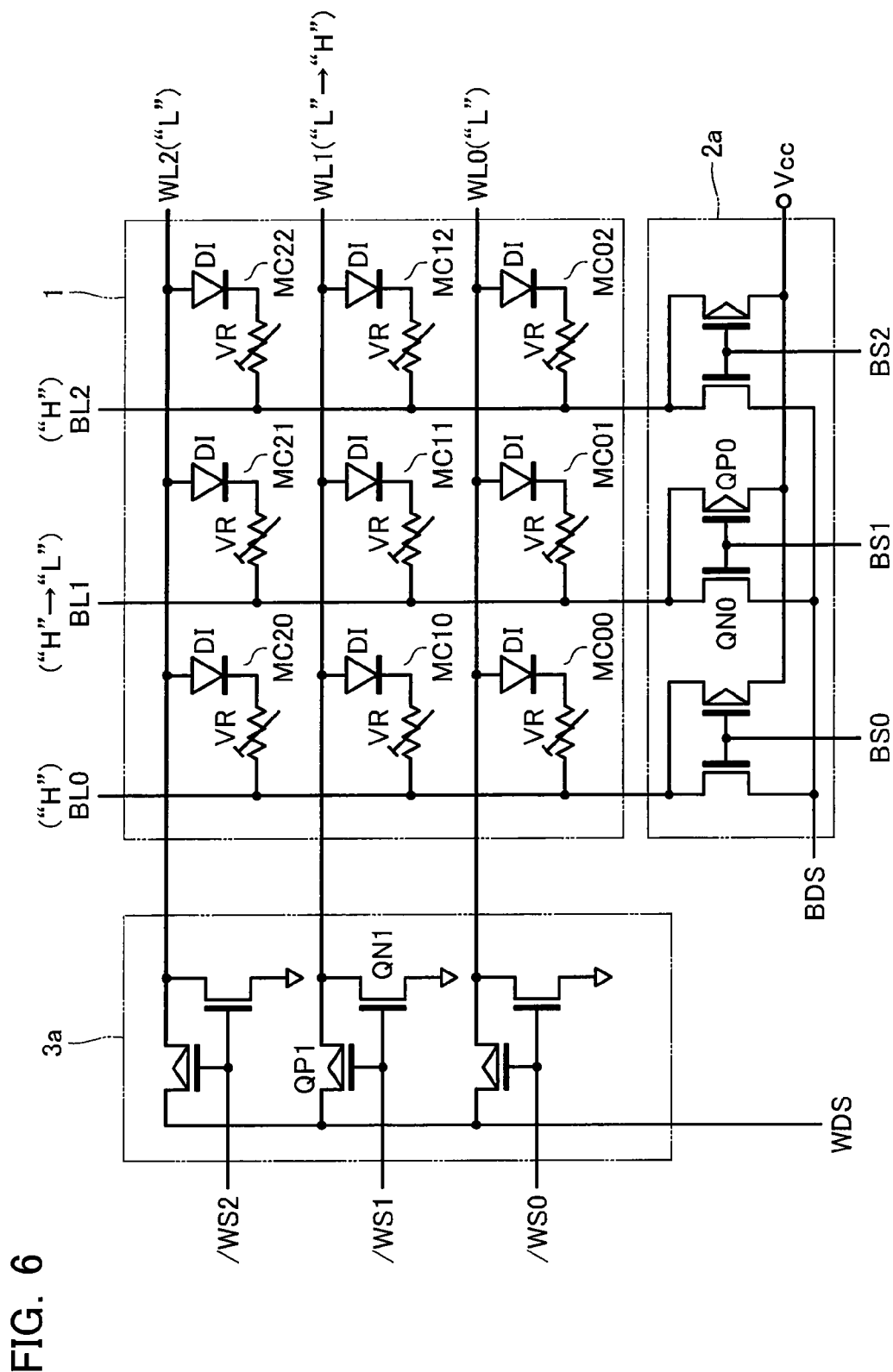
FIG. 6 is a circuit diagram of the memory cell array 1 and peripheral circuits thereof.

FIG. 6 is a circuit diagram of the memory cell array 1 and peripheral circuits thereof. For simplicity, the description advances on the assumption that the memory has a single-layered structure. In FIG. 6, the diode DI contained in the memory cell MC has an anode connected to the word line WL and a cathode connected to the bit line BL via the variable resistor VR. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit line side drive sense line BDS, which is used to apply a write pulse and supply a detection current at a time of data read. The transistors QP0, QN0 have a common drain connected to the bit line BL, and a common gate supplied with a bit line selection signal BSi for selecting each bit line BL.

The selection circuit 3a includes a selection PMOS transistor QP1 and a selection NMOS transistor QN1, provided at each word line WL, of which gates and drains are commonly connected. The selection PMOS transistor QP1 has a source connected to a word line side drive sense line WDS, which is used to apply a write pulse and supply a detection current at a time of data read. The selection NMOS transistor QN1 has a source connected to a low potential source Vss. The transistors QP1, QN1 have a common drain connected to the word line WL and a common gate supplied with a word line selection signal /WSi for selecting each word line WL.

The example shown above is suitable for selecting the memory cells individually. In contrast, in batch read of data from plural memory cells MC connected to the word line WL, sense amplifiers are arranged individually for the bit lines BL0~BL2, and the bit lines BL0~BL2 are connected to the sense amplifiers individually by the bit-line selection signal BS via the selection circuit 2a. The memory cell array 1 may include a diode DI of which polarity is inverted from the circuit shown in FIG. 6 (connected so that a direction from the bit line BL to the word line WL is a forward direction) to supply a current flow from the bit line BL to the word line WL.

As mentioned previously, the variable resistor VR is configured from a composite oxide film of silicon oxide (SiO2) and a transition metal oxide, and has a proportion (atomic percentage) of the transition metal oxide in the composite oxide film set to 55~80%. Reasons for this are now described with reference to FIGS. 7 and 8.

Figure 7:
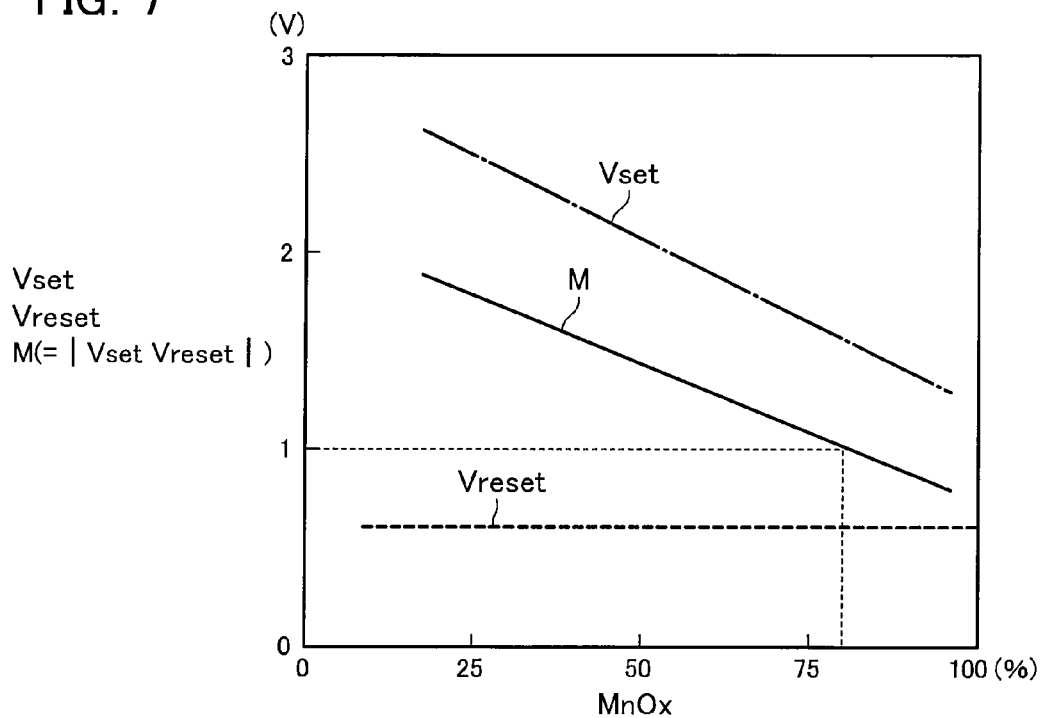
FIG. 7 describes a reason that a proportion (atomic percentage) of a transition metal oxide in a variable resistor VR is set to 55~80%.

FIG. 7 is a graph showing a relationship between a atomic percentage (%) of manganese oxide (MnO2) in the composite oxide film, and the setting voltage Vset, the resetting voltage Vreset and a margin M which is a difference between the two voltages (M=|Vset−Vreset|), for a case where manganese oxide is used as the transition metal oxide. As shown in FIG. 7, the setting voltage Vset becomes smaller as the proportion of manganese oxide increases. In contrast, the resetting voltage Vreset is virtually constant irrespective of the proportion of manganese oxide. The margin M thus becomes smaller as the proportion of manganese oxide increases. A case is assumed here of a resistance change memory in which the memory cell is formed with a minimum processing dimension of 43 nm, the diode displays a forward current characteristic delivering 10 μA of current with a 1.5V applied voltage, resistance of the bit line BL and the word line WL is 2 $\Omega/cm^2$, and resistance of the variable resistor VR varies in a range of 1E+4~1E+6Ω. In this case it is required that the margin M be set to 1.0V or more. As may be understood from FIG. 7, to satisfy this requirement, the atomic percentage of manganese oxide must be set to 80% or less.

Figure 8:
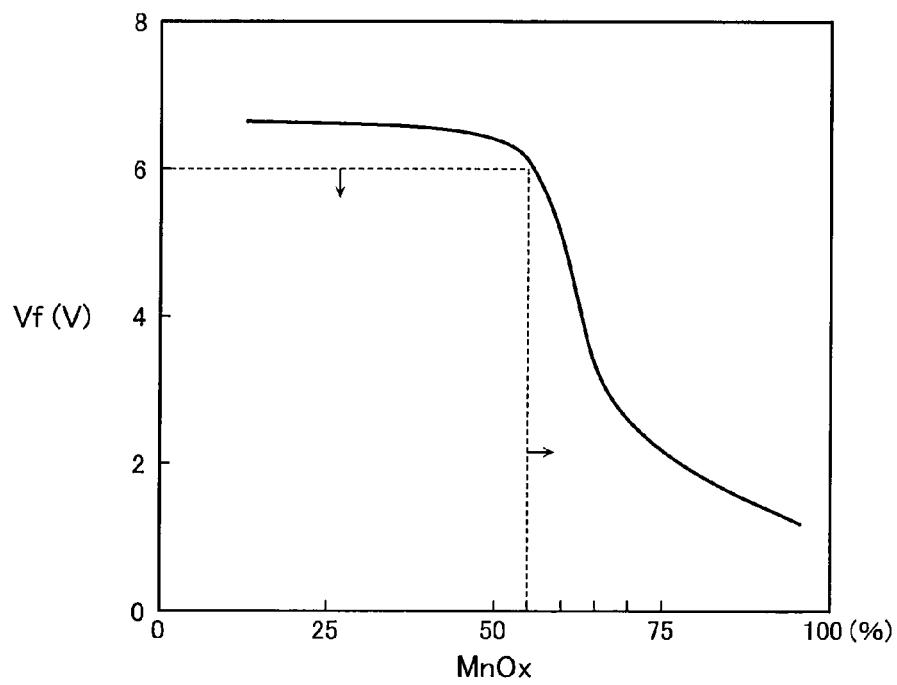
FIG. 8 describes a reason that the proportion (atomic percentage) of the transition metal oxide in the variable resistor VR is set to 55~80%.

Next, a relationship between a forming voltage Vf when forming the memory cell MC and the atomic percentage of manganese oxide is described with reference to FIG. 8. At a stage where the atomic percentage of manganese oxide is less than 50% the forming voltage Vf is 6.0V or more. This is far greater than the setting voltage Vset, and requiring such a voltage is an obstacle to reduction of power consumption. However, when the atomic percentage of manganese oxide reaches 50% or more, the forming voltage Vf gradually falls, and at 55% or more becomes 6V or less, subsequently falling sharply. Consequently it may be understood that, based on a perspective of reducing the forming voltage Vf, it is desirable to set the atomic percentage of manganese oxide to 55% or more. Putting together an analysis based on FIG. 7 and an analysis based on FIG. 8 leads to the conclusion previously set forth, namely that the proportion (atomic percentage) of the transition metal oxide in the composite oxide film is best set to 55~80%. This concludes description of the case where manganese oxide is adopted as the transition metal oxide, but it should be noted that the atomic percentage of the transition metal may be similarly set also in a case where another transition metal is used.

This concludes description of embodiments in accordance with the present invention, but it should be noted that the present invention is not limited to the above-described embodiments, and that various alterations, additions, and so on, are possible within a range not departing from the scope and spirit of the invention. For example, in the above-described embodiment, an example is described where the variable resistor VR comprises a composite film of silicon oxide and a transition metal oxide, but the present invention is not limited to this embodiment, and a film in which, for example, silicon oxide, silicon nitride and a transition metal oxide are mixed may also be made.

What is claimed is:

1. A nonvolatile semiconductor memory device, comprising:
    a memory cell array that includes a memory cell, said memory cell being disposed between a first line and a second line and being configured by a variable resistor and a rectifier connected in series,
    said variable resistor being a mixture of silicon oxide (SiO2) and a transition metal oxide, and
    a proportion of said transition metal oxide being set to 55~80%.

2. The nonvolatile semiconductor memory device according to claim 1,
    wherein said transition metal oxide is manganese oxide (MnO2).

3. The nonvolatile semiconductor memory device according to claim 1,
    wherein said variable resistor has a resistance that is variable between a first state having a first resistance distribution and a second state having a second resistance distribution that is smaller than the first resistance distribution, and
    wherein there is a difference of 1V or more between
    a first voltage and a second voltage, the first voltage being applied between said first line and said second line to switch from said first state to said second state, the second voltage being applied between said first line and said second line to switch from said second state to said first state.

4. The nonvolatile semiconductor memory device according to claim 3,
    wherein said transition metal oxide is manganese oxide (MnO2).

5. A nonvolatile semiconductor memory device, comprising:
    a memory cell array that includes a memory cell, said memory cell being disposed between a first line and a second line and being configured by a variable resistor and a rectifier connected in series,
    said variable resistor being a mixture of silicon oxide (SiO2) and a transition metal oxide, and having a resistance that is variable between a first state having a first resistance distribution and a second state having a second resistance distribution that is smaller than the first resistance distribution, and
    a proportion of said transition metal oxide being set so that there occurs a difference of 1V or more between a first voltage and a second voltage, the first voltage being applied between said first line and said second line to switch from said first state to said second state, the second voltage being applied between said first line and said second line to switch from said second state to said first state.

6. The nonvolatile semiconductor memory device according to claim 5,
wherein said transition metal oxide is manganese oxide (MnO2).

7. The nonvolatile semiconductor memory device according to claim 5,
wherein the proportion of said transition metal oxide is set so that a forming voltage applied to make said memory cell operable can be set to 6V or less.

8. A nonvolatile semiconductor memory device, comprising:
a memory cell array that includes a plurality of memory cells, each of said memory cells being disposed at intersections between first lines and second lines and being configured by a variable resistor and a rectifier connected in series,
said variable resistor being a mixture of silicon oxide (SiO2) and a transition metal oxide, and
a proportion of said transition metal oxide being set to 55~80%.

9. The nonvolatile semiconductor memory device according to claim 8,
wherein said transition metal oxide is manganese oxide (MnO2).

10. The nonvolatile semiconductor memory device according to claim 8,
wherein said variable resistor has a resistance that is variable between a first state having a first resistance distribution and a second state having a second resistance distribution that is smaller than the first resistance distribution, and
wherein there is a difference of 1V or more between
a first voltage and a second voltage, the first voltage being applied between said first line and said second line to switch from said first state to said second state, the second voltage being applied between said first line and said second line to switch from said second state to said first state.

11. The nonvolatile semiconductor memory device according to claim 10,
wherein said transition metal oxide is manganese oxide (MnO2).

12. The nonvolatile semiconductor memory device according to claim 8, wherein the proportion of said transition metal oxide is set so that a forming voltage applied to make said memory cell operable can be set to 6V or less.

* * * * *